United States Patent [19]

Renfrow et al.

[11] Patent Number: 4,985,639
[45] Date of Patent: Jan. 15, 1991

[54] LOGIC EDGE TIMING GENERATION

[75] Inventors: Denny M. Renfrow, San Jose; Francis X. Schumacher, Palo Alto; Edward R. Helder, Fremont, all of Calif.

[73] Assignee: Hewlett-Packard Company, Palo Alto, Calif.

[21] Appl. No.: 376,783

[22] Filed: Jul. 7, 1989

[51] Int. Cl.[5] .......................... H03K 5/00; H03K 5/13
[52] U.S. Cl. .................................. 307/262; 307/603; 307/268; 328/114; 328/55
[58] Field of Search ............... 307/601, 602, 603, 595, 307/265, 268, 262; 328/114, 66, 609, 55, 58, 155

[56] References Cited

U.S. PATENT DOCUMENTS

| | | | |
|---|---|---|---|
| 3,290,590 | 12/1966 | Baker | 307/603 |
| 4,645,947 | 2/1987 | Prak | 307/601 |
| 4,675,546 | 6/1987 | Shaw | 307/268 |
| 4,703,251 | 10/1987 | Baumgartner et al. | 307/603 |
| 4,748,348 | 5/1988 | Thong | 307/603 |
| 4,868,514 | 9/1989 | Azevedo et al. | 328/55 |

*Primary Examiner*—Stanley D. Miller
*Assistant Examiner*—Richard Roseen
*Attorney, Agent, or Firm*—Roland I. Griffin; Alan H. Haggard

[57] ABSTRACT

An edge generation circuit phase delays pulses of a first signal propagated on an integrated circuit. The edge generation circuit includes a first variable delay circuit located on the integrated circuit, a delay line located off the integrated circuit and a second variable delay circuit located on the integrated circuit. The first variable delay circuit receives the first signal and produces a second signal which is in phase with the first signal. The delay line receives the second signal and produces a third signal. The third signal is delayed in phase from the second by a precise amount. The second variable delay circuit receives the third signal from the delay line and produces a fourth signal. The fourth signal is in phase with the third signal.

19 Claims, 4 Drawing Sheets

LOGIC EDGE TIMING GENERATION

BACKGROUND

The present invention concerns the production of multiple logic signals with arbitrary yet highly accurate timing relative to a machine cycle.

A sequential digital state machine typically uses a machine cycle to cause logical signals to occur at known times The machine cycle is also called a system clock signal. If only one system clock signal phase is available, then the finest timing resolution that can be attained is one clock period. Finer resolutions can be obtained by producing copies of the system clock signal which are offset in phase. If multi-phases are produced as sub-multiples of the period of the system clock signal, then the improved timing resolution is the period of the sub-multiple. For example, if a system clock signal is divided into two phases, then the improved timing resolution is one half the period of the system clock signal.

For some applications within very large scale integrate (VLSI) circuits maximum system performance requires arbitrarily fine resolution of timing for a finite set of signals. The resolution of timing may be so fine that the production of such signals using sub-multiple phases of the system clock signal would require more sub-multiple phases than are generally feasible. One alternative to creating sub-multiple phases of the system clock signal is to generate copies of the system clock signal with just the phases which are required by any set of logic signals.

SUMMARY OF THE INVENTION

In accordance with the preferred embodiment of the present invention, an edge generation circuit is presented. The edge generation circuit phase delays pulses of a first signal propagated on an integrated circuit. The edge generation circuit includes a first variable delay circuit located on the integrated circuit, a delay line located off the integrated circuit and a second variable delay circuit located on the integrated circuit. The first variable delay circuit receives the first signal and produces a second signal which is in phase with the first signal. The delay line receives the second signal and produces a third signal. The third signal is delayed in phase from the second by a precise amount. The second variable delay circuit receives the third signal from the delay line and produces a fourth signal. The fourth signal is in phase with the third signal.

The present invention allows the generation of a copy of a system clock signal, the copy of the system clock signal being a precise amount out of phase with the system clock signal. In the preferred embodiment the first signal may be the system clock signal. The presence of the first variable delay circuit allows the generation of the second signal so that the second signal is precisely in phase with the system clock signal, yet so that the second signal is powerful enough to be sent off the integrated circuit. In typical prior art applications there is phase delay when such a signal is sent off the integrated circuit. The phase delay is from propagation delay through circuitry which is designed to amplify the first signal, and varies with process and temperature.

The delay line is located off the integrated circuit. This is because propagation delays within integrated circuits are highly sensitive to manufacturing processes and operating conditions. A delay line located off the integrated circuit is able to provide a precise amount of delay over a wide range of operating conditions. It also provides flexibility to economically alter phase delay from the system clock.

The second variable delay circuit allows the generation of the fourth signal so that the fourth signal is precisely in phase with the third signal. Since the third signal is precisely out of phase with the system clock signal, the fourth signal may be utilized throughout the integrated circuit as a copy of the system clock signal which has a phase which varies a precise amount from the system clock signal.

Similarly, pulses may be generated which vary a precise amount from the pulses of the system clock signal but which occur only during certain cycles of the system clock signal. This may be done by the use of parallel circuitry on the integrated circuit. A first of the parallel circuitry is used to generate feedback used to match the phase of the fourth signal with the third signal A second of the parallel circuitry is used to generated the pulses which vary a precise amount from the pulses of the system clock signal but which occur only during certain cycles of the system clock signal. The propagation delay of signals through the first of the parallel circuitry is equal to the propagation delay of signals through the second of the parallel circuitry. The second of the parallel circuitry, however, includes an enable/disable input which allows the second of the parallel circuitry to be enabled only during selected cycles of the system clock signal.

DESCRIPTION OF THE PREFERRED EMBODIMENT

Figure 1:
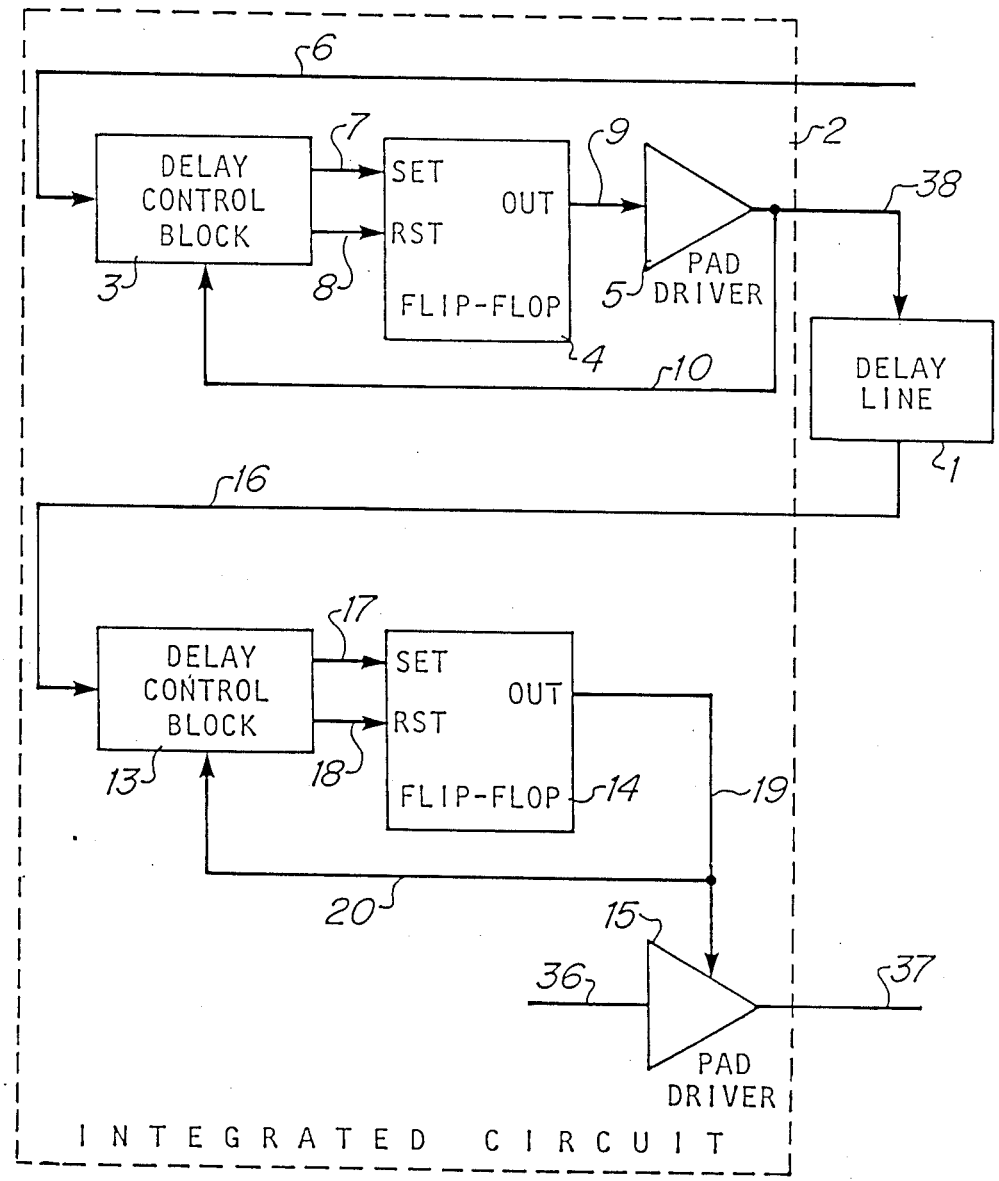
FIG. 1 shows a circuit for generating copies of a system clock signal with variable phases in accordance with the preferred embodiment of the present invention.

FIG. 1 shows a block diagram of a circuit within a VLSI chip 2. A variable delay structure consisting of delay control block 3 a flip flop 4 and a pad driver 5 produces a clock signal on a line 38 which is in phase with a clock signal on a line 6. Delay control block 3 receives the clock signal on line 6 and variably delays the clock signal to produce a flip flop set signal on a line 7 and a flip flop reset signal on a line 8. Flip flop 4 receives the flip flop set signal on line 7 and the flip flop reset signal on line 8 and generates a delayed clock signal which is placed on a line 9. Pad drive 5 generates the clock signal on line 38. A feedback loop 10 carries the clock signal to delay control block 3. Delay control block 3 varies the length of delay so that the clock signal on line 6 and the clock signal on line 38 are in phase.

The clock signal on line 38 is sent outside VLSI chip 2 and through a delay line 1. Delay line 1 may be a commercially available delay such as those available from Thin Film Technology Corporation having a business address of 1980 Commerce Drive, North Mankato, Minn. 56001. Delay line 1 delays the clock signal on line 38 to produce a delayed clock signal on a line 16.

A second variable delay structure consisting of delay control block 13, a flip flop 14 and a pad driver 15 produces a signal on a line 37. Delay control block 13 receives the delayed clock signal on line 16 and variably delays the clock signal to produce a flip flop set signal on a line 17 and a flip flop reset signal on a line 18. Flip flop 14 receives the flip flop set signal on line 17 and the flip flop reset signal on line 18 and generates a delayed clock signal which is placed on a line 19. The delayed clock signal on line 19 may be used as a phase delayed clock signal to drive circuitry throughout VLSI chip 2. In FIG. 1, the delayed clock signal on line 19 is shown controlling the flow of data on line 36 through pad driver 15 to line 37. A feedback loop 20 carries the clock signal on line 19 to delay control block 13. Delay control block 13 varies the length of delay so that the clock signal on line 16 and the clock signal on line 19 are in phase.

Figure 2:
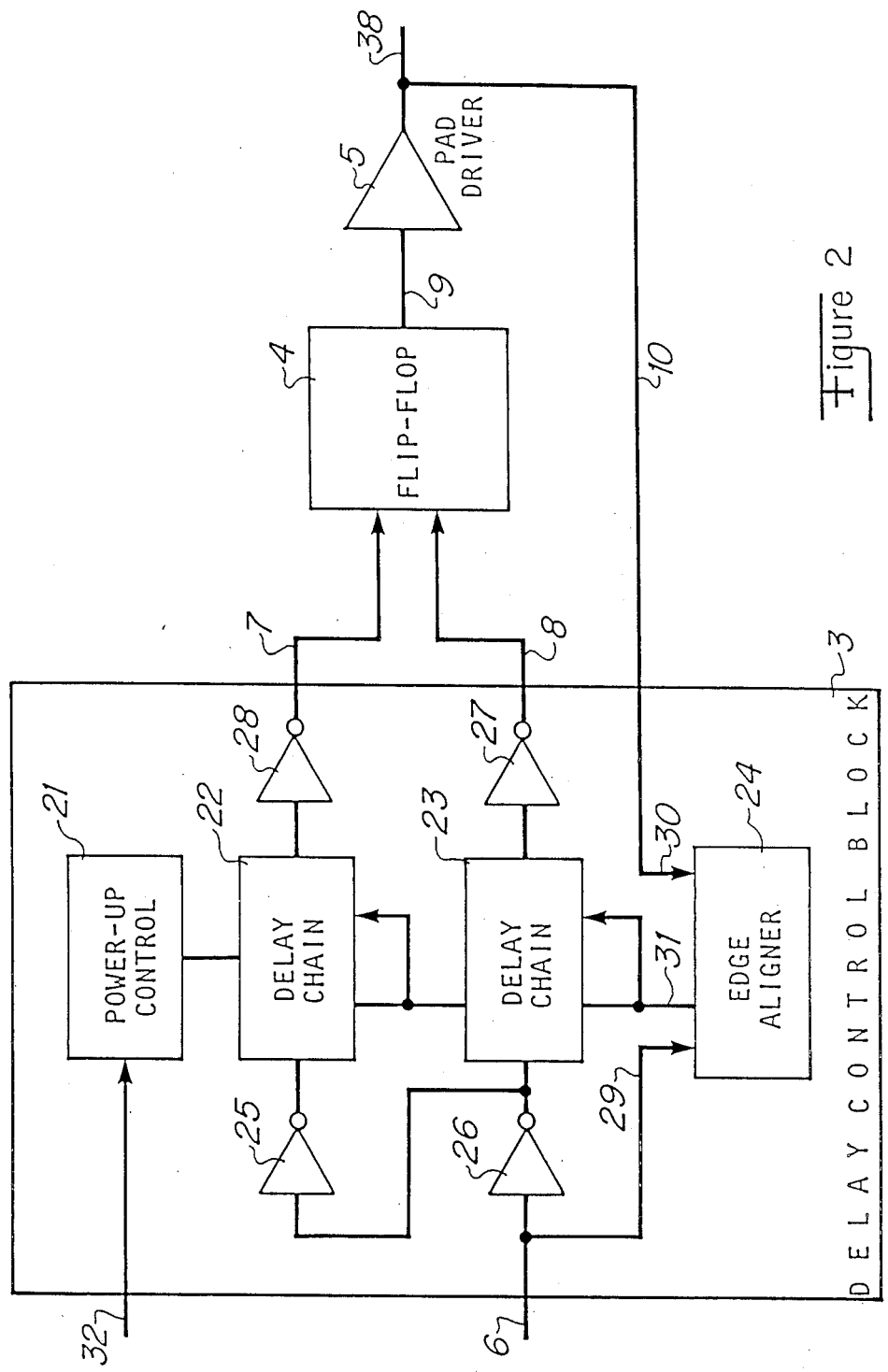
FIG. 2 shows a block diagram of a delay control block, which is part of the circuit shown in FIG. 1 in accordance with the preferred embodiment of the present invention.

FIG. 2 shows additional detail of delay control block 3. Delay control block 3 is shown to include a power-up control 21, a delay chain 22, a delay chain 23, an edge aligner 24, an inverter 25, an inverter 26, an inverter 27 and an inverter 28 connected as shown. The amount of delay through delay chain 22 and through delay chain 23 is controlled by a voltage placed on a line 31. Edge aligner 24 controls the voltage on line 31 so that input 29 of edge aligner 24 is in phase with an input 30 of edge aligner 24. Power-up control 21 has an input 32 and is used to initialize delay control block 3.

Figure 3:
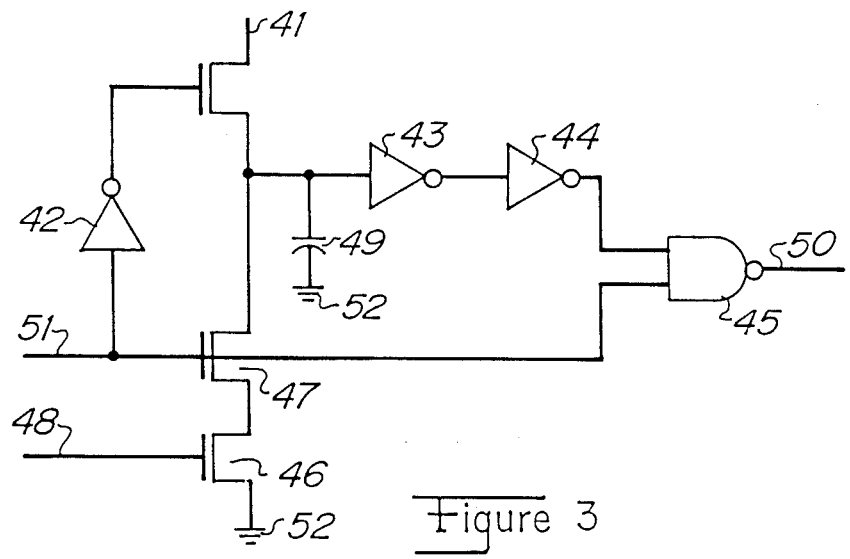
FIG. 3 shows a circuit diagram of a delay element in accordance with the preferred embodiment of the present invention.

Delay chain 22 and delay chain 23 are each composed of three delay elements An example of such a delay element is shown in FIG. 3. The delay element is composed of an inverter 42, an inverter 43, an inverter 44, a logical NAND gate 45, a capacitor 49, a field-effect transistor (FET) 41, an FET 47 and an FET 46 connected as shown. On a line 41 is placed a power voltage which is 3.0 volts with respect to a reference voltage 52. FET 46 operates as a variable resistor. The amount of resistance through 46 is controlled by a voltage placed on a gate 48. Gate 48 is connected to line 31. The amount of resistance through FET 46 controls the time it takes to discharge capacitor 49. The discharge time of capacitor 49 controls the delay of the signal from input 51 to output 50.

Figure 4:
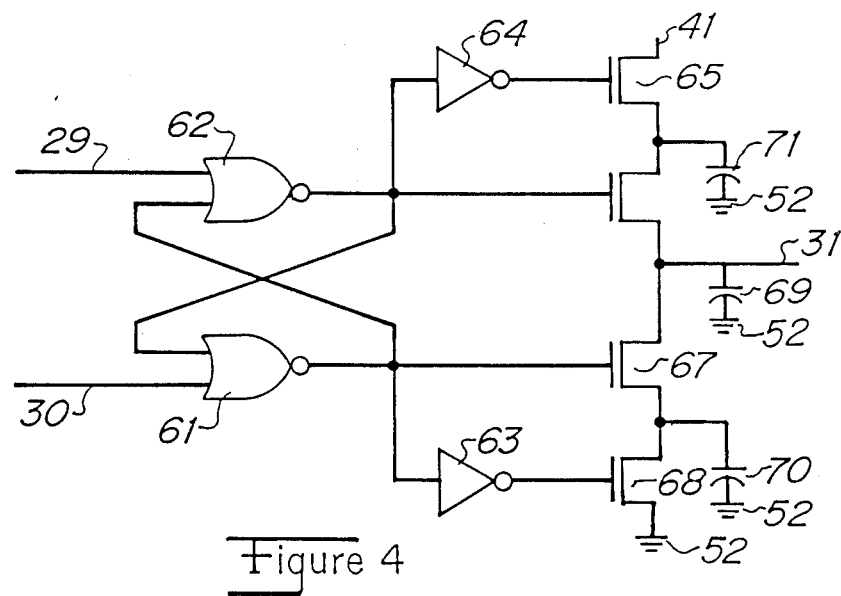
FIG. 4 shows a circuit diagram of an edge aligner shown in FIG. 2, in accordance with the preferred embodiment of the present invention.

FIG. 4 shows a circuit diagram of edge aligner 24. Edge aligner 24 is shown to include a logical NOR gate 62, a logical NOR gate 61, an inverter 63, an inverter 64, a FET 65, a FET 66, a FET 67, a FET 68, a capacitor 71, a capacitor 69 and a capacitor 70 connected as shown. The control voltage placed on line 31 results from charge stored in a relatively large capacitor 69. The charge in a smaller capacitor 70 and in a smaller capacitor 71 are used to adjust the charge in capacitor 69. When the voltage on lin 31 is in operating range, the signal on line 29 and the signal on line 30 have overlapping high times. Depending on which signal's falling edge occurs first, NOR gate 61 and NOR gate 62 connect either capacitor 71 or capacitor 70 to line 31, respectively charging or discharging capacitor 69. This respectively adjust the voltage on line 31 upwards or downwards. This small adjustment decreases or increases the delay through delay elements in delay chain 22 and delay chain 23 until the falling edge of the signal on line 29 is in phase with the falling edge of the signal on line 30.

Figure 5:
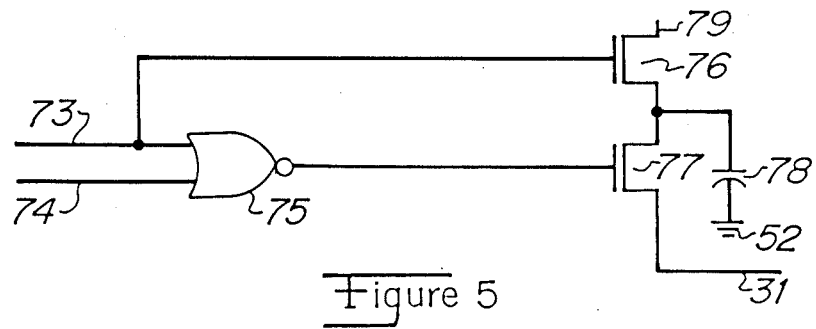
FIG. 5 shows power up control circuitry used for power up of the delay control block shown in FIG. 2.

FIG. 5 shows a circuit diagram of power up control 21. Power up control 21 is shown to consist of a logical NOR gate 75, an FET 76, an FET 77 and a capacitor 78. Power up control 21 is designed to charge up capacitor 69 to its operating range. Line 73 is connected to the output of the first of the three delay elements of delay chain 23. Line 74 is connected to the output of the third of the three delay elements of delay chain 23. If the low pulse of the signal on line 73 and the low pulse of the signal on line 74 overlap, then the delay through delay chain 23 is greater than 1 period. This means that the charge in capacitor 69 produces a voltage on line 31 that is too low and edge aligner 24 may not be in its operating range. Therefore, when the low pulse of the signal on line 73 and the low pulse of the signal on line 74 overlap, logical NOR gate 75 opens FET 77 allowing the charge on capacitor 78 to charge capacitor 69. This will increase the charge on capacitor 69 until the voltage on line 31 is in operating range.

Figure 6:
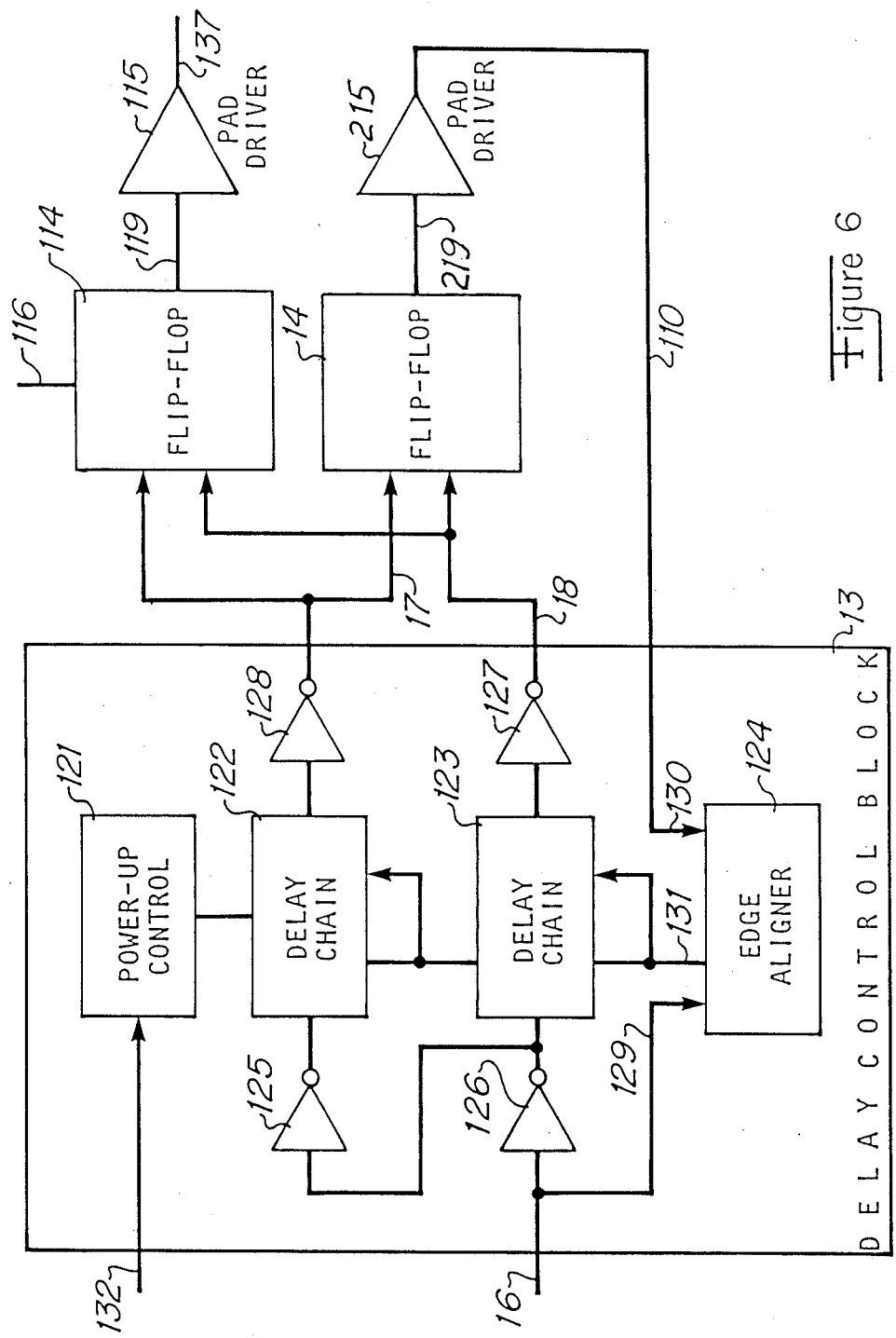
FIG. 6 shows the block diagram of a delay control block modified to allow qualified edge generation in accordance with the preferred embodiment of the present invention.

As shown in FIG. 1, the second variable delay structure consisting of control block 13 and flip flop 14 produces on line 19 a phase delayed clock signal for every cycle of the clock signal placed on line 6. FIG. 6 shows a modification to the second variable delay structure which allows the second variable delay structure to produce on a line 137 a phase delayed clock signal only on selected cycles of the clock signal.

In FIG. 6, delay control block 13 is shown to include a power-up control 121, a delay chain 122, a delay chain 123, an edge aligner 124, an inverter 125, an inverter 126, an inverter 127 and an inverter 128 connected as shown. The amount of delay through delay chain 122 and through delay chain 123 is controlled by a voltage placed on a line 131. Edge aligner 124 controls the voltage on line 131 so that input 129 of edge aligner 124 is in phase with an input 130 of edge aligner 124. A power-up control 121 with an input 132 is used to initialize delay control block 13.

In the variable delay structure shown in FIG. 6, feedback line 110 is connected to the output of pad driver 215. The signal on feedback line 110 is phase locked to the delayed clock signal on line 16 by delay control block 13. In addition to being connected to flip flop 14, the flip flop set signal on line 17 and the flip flop reset signal on line 18 are also connected to flip flop 114. Flip flop 114 receives the flip flop set signal on line 17 and the flip flop reset signal on line 18 and generates a delayed clock signal which is placed on a line 119. Line 119 is used as input to a pad driver 115. Pad driver 115 produces a signal on line 137. A disable input 116 may be used to enable/disable flip flop 114. By placing a qualifying signal on line 116, it is possible to choose for which cycles of the system clock signal flip flop 114 will be enabled or disable. In this way, edge generation of the signal on line 137 may be performed only on selected cycles of the system clock signal.

We claim:

1. An edge generation circuit which phase delays pulses of a first signal propagated on an integrated circuit, the edge generation circuit comprising:

a first variable delay circuit on the integrated circuit, the first variable delay circuit receiving the first signal and producing a second signal, the second signal being in phase with the first signal;

a delay line located off the integrated circuit, the delay line receiving the second signal and delaying the second signal to produce a third signal; and, a second variable delay circuit on the integrated circuit, the second variable delay circuit receiving the third signal and producing a fourth signal, the fourth signal being in phase with the third signal.

2. An edge generation circuit as in claim 1 wherein the first variable delay circuit includes:

at least one delay chain, each of the at least one delay chain having an input receiving the first signal, an output and a control line, the amount of delay the delay chain delays a signal propagated from the input to the output being determined by a voltage placed on the control line; and an aligner means, coupled to each control line of the at least one delay chain, for receiving the first signal and the second signal and for varying the voltage on the control line of each of the at least one delay chain so that the second signal is in phase with the first signal.

3. An edge generation circuit as in claim 2, wherein the first variable delay circuit additionally includes a flip flop circuit, the flip flop circuit receiving signals from the at least one delay chain and generating a flip flop output signal; and, driver means, coupled to the flip flop, for receiving the flip flop output signal and for producing the second signal.

4. An edge generation circuit as in claim 2, wherein the first variable delay circuit additionally includes:

a power-up control circuit, coupled to each control line of the at least one delay chain, for varying the voltage on the control line to bring the first variable delay circuit within an operating range of the aligner means.

5. An edge generation circuit as in claim 2 wherein the second variable delay circuit includes:

at least one delay chain, each of the at least one delay chain having an input receiving the first signal, an output and a control line, the amount of delay the delay chain delays a signal propagated from the input to the output being determined by a voltage placed on the control line; and, an aligner means, coupled to each control line of the at least one delay chain, for receiving the third signal and the fourth signal and for varying the voltage on the control line of each of the at least one delay chain so that the third signal is in phase with the fourth signal.

6. An edge generation circuit as in claim 5, wherein the second variable delay circuit additionally including:

a first flip flop circuit, the first flip flop circuit receiving signals from the at least one delay chain and generating a first flip flop output signal; and, first driver means, coupled to the first flip flop circuit, for receiving the first flip flop output signal and for producing the fourth signal.

7. An edge generation circuit as in claim 6 additionally including:

a second flip flop circuit the second flip flop circuit having an enable/disable input, the second flip flop circuit receiving signals from the at least one delay chain and generating a second flip flop output signal when the enable/disable input is set to an enable voltage; and, second driver means, coupled to the second flip flop circuit, for receiving the second flip flop output signal and for producing a fifth signal.

8. An edge generation circuit as in claim 5, wherein the second variable delay circuit additionally includes:

a power-up control circuit, coupled to each control line of the at least one delay chain, for varying the voltage on the control line to bring the first variable delay circuit within an operating range of the aligner means.

9. An edge generation circuit as in claim 1 wherein the second variable delay circuit includes:

at least one delay chain, each of the at least one delay chain having an input receiving the first signal, an output and a control line, the amount of delay the delay chain delays a signal propagated from the input to the output being determined by a voltage placed on the control line; and, an aligner means, coupled to each control line of the at least one delay chain, for receiving the third signal and the fourth signal and for varying the voltage on the control line of each of the at least one delay chain so that the third signal is in phase with the fourth signal.

10. An edge generation circuit as in claim 9, wherein the second variable delay circuit additionally including:

a first flip flop circuit, the first flip flop circuit receiving signals from the at least one delay chain and generating a first flip flop output signal; and, first driver means, coupled to the first flip flop circuit, for receiving the first flip flop output signal and for producing the fourth signal.

11. An edge generation circuit as in claim 10 additionally including:

a second flip flop circuit, the second flip flop circuit having an enable/disable input, the second flip flop circuit receiving signals from the at least one delay chain and generating a second flip flop output signal when the enable/disable input is set to an enable voltage; and, second driver means, coupled to the second flip flop circuit, for receiving the second flip flop output signal and for producing a fifth signal.

12. An edge generation circuit as in claim 9, wherein the second variable delay circuit additionally includes:

a power-up control circuit, coupled to each control line of the at least one delay chain, for varying the voltage on the control line to bring the first variable delay circuit within an operating range of the aligner means.

13. An edge generation circuit as in claim 1 wherein the second variable delay circuit includes:

delay means for delaying the third signal to produce a first delayed signal;

first logic circuitry, the first logic circuitry receiving the first delayed signal and producing phase delay pulses for use by circuitry within the integrated circuit; and, second logic circuitry, the second logic circuitry receiving the first delayed signal and producing a feedback signal for use by the delay means;

wherein propagation delay through the first logic circuitry is equivalent to propagation delay through the second logic circuitry.

14. An edge generation circuit as in claim 13 wherein: the first logic circuitry includes a first flip flop circuit, the first flip flop circuit receiving the first delayed signal, the first flip flop circuit having an enable/disable input, the first flip flop circuit generating a first flip flop output signal when the enable/disable input is set to an enable voltage, and first driver means, coupled to the first flip flop circuit, for receiving the first flip flop output signal and producing the phase delay pulses; and, the second logic circuitry includes a second flip flop circuit, the first flip flop circuit receiving the first delayed signal, the second flip flop circuit generating a second flip flop output signal and second driver means, coupled to the second flip flop circuit, for receiving the second flip flop output signal and for producing the feedback signal.

15. A method for generating phase delay pulses of a first signal propagated on an integrated circuit, the method comprising the steps of:

(a) on the integrated circuit delaying the first signal to produce a first signal which is in phase with the second signal;

(b) outside the integrated circuit delaying the second signal to produce a third signal which is out of phase with the second signal; and, (c) on the integrated circuit delaying the third signal to produce a fourth signal which is in phase with the third signal.

16. A method as in claim 15 additionally comprising the steps of:

(d) on the integrated circuit delaying the third signal to produce a fifth signal.

17. A method as in claim 16 wherein propagation delay of step d which producer the fifth signal is equal to propagation delay of step C which produces the fourth signal, and wherein the fifth signal consists of pulses which are in phase with pulses of the fourth signal but the fifth signal includes pulses only during selected cycles of the fourth signal.

18. An edge generation circuit which phase delays pulses of a first signal propagated on an integrated circuit, the edge generation circuit comprising:

a delay line located off the integrated circuit, the delay line receiving the first signal and delaying the first signal to produce a second signal; and, a variable delay circuit on the integrated circuit, the variable delay circuit receiving the second signal and producing a third signal, the third signal being in phase with the second signal, the variable delay circuit including delay means for delaying the second signal to produce a first delayed signal;

first logic circuitry, the first logic circuitry receiving the first delayed signal and producing phase delay pulses for use by circuitry within the integrated circuit; and, second logic circuitry, the second logic circuitry receiving the first delayed signal and producing a feedback signal for use by the delay means;

wherein propagation delay through the first logic circuitry is equivalent to propagation delay through the second logic circuitry.

19. An edge generation circuit as in claim 18 wherein:

the first logic circuitry includes a first flip flop circuit, the first flip flop circuit receiving the first delayed signal, the first flip flop circuit having an enable/disable input, the first flip flop circuit generating a first flip flop output signal when the enable/disable input is set to an enable voltage, and first driver means, coupled to the first flip flop circuit, for receiving the first flip flop output signal and producing the phase delay pulses; and, the second logic circuitry includes a second flip flop circuit, the first flip flop circuit receiving the first delayed signal, the second flip flop circuit generating a second flip flop output signal, and second driver means, coupled to the second flip flop circuit, for receiving the second flip flop output signal and for producing the feedback signal.

* * * * *

UNITED STATES PATENT AND TRADEMARK OFFICE
CERTIFICATE OF CORRECTION

PATENT NO. : 4,985,639
DATED : January 15, 1991
INVENTOR(S) : Denny M. Renfrow et al.

It is certified that error appears in the above-identified patent and that said Letters Patent is hereby corrected as shown below:

Column 1,
Line 21, delete "inte-"
Line 22, delete "grate" and insert therefor -- integrated --

Column 2,
Line 21, after "signal" insert -- . --

Column 4,
Line 16, after "23." insert -- Line 74 is connected to the output of the third of the three delay elements of delay chain 23. --

Column 5,
Line 19, after "and" insert -- , --
Line 27, after "includes" insert -- : --

Column 7,
Line 38, delete "producer" and insert therefor -- produces --
Line 39, delete "C" and insert therefor -- c --

Signed and Sealed this

Twenty-second Day of July, 2003

JAMES E. ROGAN
*Director of the United States Patent and Trademark Office*